(12) United States Patent
Maruyama et al.

(10) Patent No.: US 8,227,703 B2
(45) Date of Patent: Jul. 24, 2012

(54) MULTILAYERED CIRCUIT BOARD AND SEMICONDUCTOR DEVICE

(75) Inventors: Hironori Maruyama, Utsunomiya (JP); Kensuke Nakamura, Utsunomiya (JP); Toru Meura, Utsunomiya (JP); Hiroshi Hirose, Yokohama (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 333 days.

(21) Appl. No.: 12/593,749

(22) PCT Filed: Jan. 17, 2008

(86) PCT No.: PCT/JP2008/050524
§ 371 (c)(1),
(2), (4) Date: Sep. 29, 2009

(87) PCT Pub. No.: WO2008/120481
PCT Pub. Date: Oct. 9, 2008

(65) Prior Publication Data
US 2010/0025093 A1    Feb. 4, 2010

(30) Foreign Application Priority Data

Apr. 3, 2007  (JP) .................................. 2007-097871
Jul. 20, 2007  (JP) .................................. 2007-188945

(51) Int. Cl.
*H05K 1/03*    (2006.01)

(52) U.S. Cl. ........ 174/256; 174/258; 174/260; 174/250; 257/635; 257/642; 257/701; 257/734

(58) Field of Classification Search .......... 174/250–260; 29/825–887; 257/635, 642, 701, 734
See application file for complete search history.

(56) References Cited

U.S. PATENT DOCUMENTS

| | | | | |
|---|---|---|---|---|
| 6,441,314 B2 * | 8/2002 | Rokugawa et al. | ........... | 174/255 |
| 6,562,179 B1 | 5/2003 | Ikeguchi et al. | | |
| 6,797,367 B2 * | 9/2004 | Kurosaki et al. | ............. | 428/209 |
| 6,939,738 B2 * | 9/2005 | Nakatani et al. | ............. | 438/108 |
| 7,198,996 B2 * | 4/2007 | Nakatani et al. | ............. | 438/184 |
| 7,397,000 B2 * | 7/2008 | Shimoto et al. | ............... | 174/258 |
| 7,474,538 B2 * | 1/2009 | Kikuchi et al. | ............... | 361/780 |
| 7,745,736 B2 * | 6/2010 | Ogawa et al. | ................. | 174/262 |

FOREIGN PATENT DOCUMENTS

| | | |
|---|---|---|
| JP | 2001-277426 | 10/2001 |
| JP | 2001-279006 | 10/2001 |
| JP | 2005-38906 | 2/2005 |

OTHER PUBLICATIONS

International Search Report mailed Feb. 19, 2008 for International Application No. PCT/JP2008/050524.

* cited by examiner

*Primary Examiner* — Angel R Estrada
*Assistant Examiner* — Dimary Lopez
(74) *Attorney, Agent, or Firm* — Smith, Gambrell & Russell, LLP

(57) ABSTRACT

A multilayered circuit board of the present invention has a single-side laminated structure and does not include a core substrate having via-holes formed therethrough and vias for providing electrical connection through the via-holes. The multilayered circuit board includes a plurality of pairs of layers, each pair including a conductor circuit layer and an insulator layer, wherein a glass transition temperature of each insulator layer is 170° C. or higher, a coefficient of thermal expansion at the glass transition temperature or lower of each insulator layer is 35 ppm or less, and a modulus of elasticity of each insulator layer is 5 GPa or more.

5 Claims, 7 Drawing Sheets

MULTILAYERED CIRCUIT BOARD AND SEMICONDUCTOR DEVICE

TECHNICAL FIELD

The present invention relates to a multilayered circuit board which is used in a semiconductor field and a semiconductor device provided with the multilayered circuit board, wherein the multilayered circuit board is characterized in that it does not include a core substrate having via-holes formed therethrough and vias for providing electrical connection through the via-holes. More specifically, the present invention relates to a multilayered circuit board having a single-side laminated structure which is manufactured by laminating conductor circuit layers and insulator layers alternately using a build-up process and a semiconductor device in which the multilayered circuit board is used.

BACKGROUND ART

Recently, due to progression of high density mount technology in a semiconductor field, area mount technology tends to be used instead of conventional surface mount technology. New packages such as BGA (Ball Grid Array) and CSP (Chip Scale Package) have been developed and they are widely used. Further, speeding up of information transfer also progresses. For these reasons, a rigid board for an interposer is attracting attention than before. Therefore, development of a rigid board having characteristics such as high thermal resistance, low thermal expansivity and low permittivity is strongly demanded.

High density mounting of electronic parts as well as high density integration thereof progress according to the demand of high functionalization of electronic devices or apparatuses. Further, downsizing and miniaturization, and high density integration of semiconductor multilayered circuit boards are also progressing than before in response to the demand of the high density integration of the electronic parts. A build-up multilayered circuit board is widely used in order to respond to the demand of the high density integration of the semiconductor multilayered circuit boards.

Further, in order to make the semiconductor multilayered circuit boards further thinner and to allow them to process signals in high speed, a multilayered circuit board in which conductor circuit layers and insulator layers are single-side laminated alternately (see FIG. 2) is proposed, instead of a conventional build-up multilayered circuit board (see FIG. 1). Further, such a multilayered circuit board does not include a core substrate having via-holes formed therethrough and vias for providing electrical connection through the via-holes. Furthermore, inner pads are formed on one surface of the multilayered circuit board and outer pads are formed on the other surface thereof (see, e.g., patent document 1: Japanese Patent Application Laid-open No. 2000-323613).

However, since the conductor circuit layers and the insulator layers are single-side laminated together, in the case where conventional insulator layers are used as the insulator layers, there is a problem in that the multilayered circuit board largely warps in a manufacturing process thereof. This is because a modulus of elasticity of each conventional insulator layer is lowered by making it thinner and coefficients of thermal expansion of each conductor layer and each conventional insulator layer are different from each other.

In order to suppress occurrence of the warp of the multilayered circuit board, the following method is considered (see, e.g., patent document 2: WO 2003/039219). In such a method, two metal plates are united together to form a composite metal plate, and conductor circuit layers and insulator layers are laminated alternately on each of the both surfaces of the composite metal plate. Thereafter, the composite metal plate is separated into the two metal plates each having a laminated structure including the conductor circuit layers and the insulator layers, and then each metal plate is subjected to an etching treatment to remove the metal plate, thereby forming two or more multilayered circuit boards. In this way, the multilayered circuit boards can be obtained. However, even in the case where such a method is used, the above problem cannot be sufficiently solved.

DISCLOSURE OF THE INVENTION

It is an object of the present invention to provide a multilayered circuit board having a single-side laminated structure in which warp is difficult to occur and a semiconductor device in which the multilayered circuit board on which semiconductor elements are mounted is used. More specifically, it is an object of the present invention to provide a multilayered circuit board in which warp is difficult to occur in the step of mounting the semiconductor elements thereon and a semiconductor device provided with the multilayered circuit board in which warp is difficult to occur in the step of carrying out a reliability test.

In order to achieve the object, the present invention includes the following features (1) to (8):

(1) A multilayered circuit board having a single-side laminated structure, the multilayered circuit board which does not include a core substrate having via-holes formed therethrough and vias for providing electrical connection through the via-holes, comprising:

a plurality of pairs of layers, each pair including a conductor circuit layer and an insulator layer, wherein a glass transition temperature of each insulator layer is 170° C. or higher, a coefficient of thermal expansion at the glass transition temperature or lower of each insulator layer is 35 ppm or less, and a modulus of elasticity of each insulator layer is 5 GPa or more.

(2) The multilayered circuit board according to the above feature (1), wherein at least one insulator layer includes a fiber base member.

(3) The multilayered circuit board according to the above feature (2), wherein the insulator layer including the fiber base member further comprises at least a first resin layer and a second resin layer in addition to the fiber base member, wherein the fiber base member is provided between the first and second resin layers.

(4) The multilayered circuit board according to the above feature (3), wherein in the case where a thickness of the first resin layer is defined as "B1" and a thickness of the second resin layer is defined as "B2", B1 and B2 satisfy 0<B2/B1≦1.

(5) The multilayered circuit board according to the above feature (2), wherein a thickness of the fiber base member included in the insulator layer is in the range of 10 to 35 μm.

(6) The multilayered circuit board according to the above feature (2), wherein the fiber base member is a glass cloth.

(7) The multilayered circuit board according to the above feature (1), wherein the insulator layer is formed of a resin composition containing cyanate resin.

(8) A semiconductor device in which the multilayered circuit board according to the above feature (1) is used.

BEST MODE FOR CARRYING OUT THE INVENTION

The present invention refers to a multilayered circuit board which is used in a semiconductor field. The multilayered circuit board can be used in a semiconductor element mounted board such as a BGA or the like.

Figure 1:
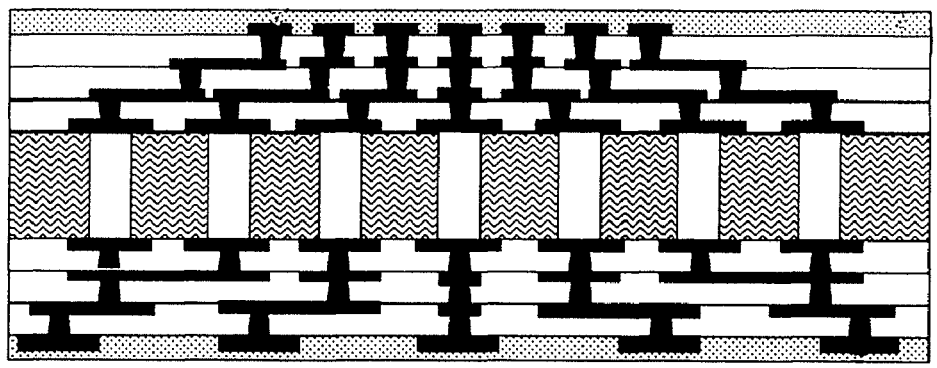
FIG. 1 is a view showing a conventional typical multilayered circuit board.
Figure 2:
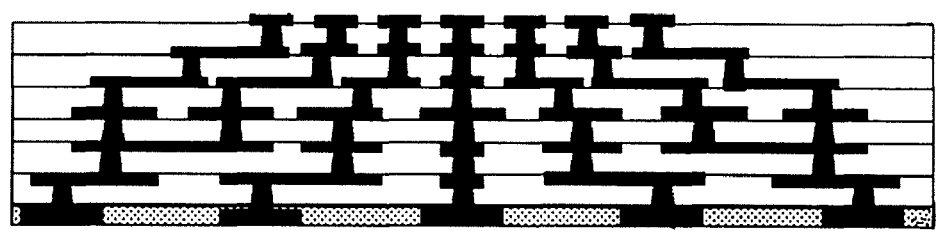
FIG. 2 is a view schematically showing a structure of a multilayered circuit board according to the present invention.

FIG. 1 is a view showing a conventional typical multilayered circuit board. FIG. 2 is a view schematically showing a structure of the multilayered circuit board according to the present invention. The multilayered circuit board has a single-side laminated structure and does not include a core substrate having via-holes formed therethrough and vias for providing electrical connection through the via-holes. Further, the multilayered circuit board comprises a plurality of pairs of layers, each pair including a conductor circuit layer and an insulator layer. Furthermore, inner pads are formed on one surface of the multilayered circuit board and outer pads are formed on the other surface of the multilayered circuit board.

A glass transition temperature of each insulator layer to be used in the multilayered circuit board of the present invention is preferably 170° C. or higher, and more preferably 175° C. or higher. If the glass transition temperature of each insulator layer is lower than the lower limit value of the above range, warp of the multilayered circuit board becomes large when it is cooled up to a room temperature after being heated in a manufacturing process thereof. Examples of a factor for controlling the warp of the multilayered circuit board include a coefficient of thermal expansion at the glass transition temperature or lower of each insulator layer. In the case where the coefficient of thermal expansion of each insulator layer is 35 ppm or more, it becomes larger than twice or more as compared with a coefficient of thermal expansion of copper usually used for forming the conductor circuit layer (17 to 18 ppm/° C.). This causes large warp of the multilayered circuit board. Further, it is preferred that a modulus of elasticity of each insulator layer is 5 GPa or more. Since the multilayered circuit board of the present invention does not include a core layer (core substrate) unlike the conventional multilayered circuit board, the modulus of elasticity of each insulator layer is preferably 5 GPa or more in order to maintain a shape of the multilayered circuit board.

It is preferred that the insulator layer to be used in the present invention includes a glass fiber base member or an organic fiber member as a fiber base member. Examples of the glass fiber base member include a glass cloth such as a glass woven cloth or a glass non-woven cloth. Further, examples of the organic fiber member include an organic woven cloth, an organic non-woven cloth and the like. It is preferred that the multilayered circuit board has at least one insulator layer including the fiber base member. Since fiber bundles constituting the fiber base member hardly bend, such an insulator layer including the fiber base member can have an excellent mechanical property such as a modulus of elasticity.

Further, it is preferred that the insulator layer including the fiber base member comprises at least a first resin layer and a second resin layer in addition to the fiber base member, wherein the fiber base member is provided between the first and second resin layers.

According to a preferred embodiment of the present invention, in the case where a thickness of the first resin layer of the insulator layer is defined as "B1" and a thickness of the second resin layer thereof is defined as "B2", it is preferred that B1 and B2 satisfy 0<B2/B1≦1. Namely, the fiber base member is preferably located close to one surface of the insulator layer in a thickness direction thereof (unevenly distributed in the thickness direction of the insulator layer). Here, in the case where a conventional insulator layer is used, if amounts of resin compositions required for being embedded in inner circuit patterns (conductor circuit layers) are different from each other, there is a case that a resin composition constituting the conventional insulator layer is squeezed out of the inner circuit pattern or a case that the resin composition cannot be embedded in the inner circuit pattern sufficiently. According to the insulator layer to be used in the present invention, a position of the fiber base member can be set in the thickness direction thereof by preferably changing the thicknesses of the first and second resin layers. Therefore, in the above case, a resin composition constituting the first resin layer and a resin composition constituting the second resin layer can be embedded into the inner circuit patterns sufficiently and can be reliably prevented from being squeezed out of the inner circuit patterns.

The above ratio (B2/B1) is preferably 0.5 or less, and more preferably in the range of 0.2 to 0.4. In the case where the ratio (B2/B1) is set to a value within the above range, it is possible to especially lower undulating of the fiber base member. This makes it possible to further improve flatness of the insulator layer.

It is preferred that the insulator layer to be used in the present invention is formed of a resin composition containing cyanate resin in order to make the coefficient of thermal expansion thereof smaller. Examples of the cyanate resin include a reaction product obtained by reacting cyanogen halide and phenol, a prepolymer obtained by heating the reaction product and the like. Specifically, examples of such cyanate resin include novolak type cyanate resin, bisphenol type cyanate resin such as bisphenol A type cyanate resin, bisphenol E type cyanate resin or tetramethyl bisphenol F type cyanate resin, and the like.

Among these cyanate resins, the novolak type cyanate resin is preferably used. By using the novolak type cyanate resin, it is possible for the insulator layer to have an increased crosslink density when being cured, thereby improving heat resistance of the cured insulator layer. Further, it is also possible to impart excellent rigidity (modulus of elasticity) to the cured insulator layer even if a fiber base member having a thin thickness is used, thereby improving the rigidity (modulus of elasticity) of the cured insulator layer when heating it.

Therefore, by using a multilayered circuit board including the insulator layers as a package substrate for mounting a semiconductor element, it is possible to improve connection reliability between the multilayered circuit board and the semiconductor element.

Further, by using the novolak type cyanate resin, it is also possible to improve flame retardancy of the cured insulator layer. It can be supposed that the improved flame retardancy is achieved due to formation of carbonized portions in the cured insulator layer. This is because the novolak type cyanate resin has a high content of benzene rings due to its structure, and the benzene rings contained in the novolak type cyanate resin are easily carbonized (graphitized).

As the novolak type cyanate resin, one represented by, for example, the following formula (1) is preferably used.

[formula 1]

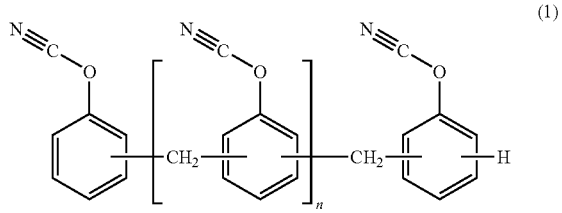

(1)

An average number of repeating units "n" of the novolak type cyanate resin represented by the above formula (1) is preferably in the range of 1 to 10, and more preferably in the range of 2 to 7.

In this case, it is possible to easily handle the novolak type cyanate resin, and to increase the crosslink density of the cured insulator layer. Further, these properties can be exhibited in a fine balance.

In contrast, if the average number of the repeating units "n" is less than the above lower limit value, the novolak type cyanate resin tends to be crystallized, thereby lowering solubility of the novolak type cyanate resin in general purpose-solvents. As a result, there is a case that it is difficult to handle a varnish containing the resin composition. On the other hand, if the average number of the repeating units "n" exceeds the above upper limit value, the crosslink density of the cured insulator layer becomes too high, and therefore there is a case that phenomenons that water resistance and mechanical strength of the cured insulator layer are lowered occur.

A weight average molecular weight (Mw) of the cyanate resin is preferably in the range of 500 to 4,500, and more preferably in the range of 600 to 3,000.

In this case, it is possible to easily handle an insulator layer with a carrier when it is formed. It is also possible to improve moldability of the insulator layer and peel strength between the insulator layer and the conductor circuit layer when manufacturing the multilayered circuit board. Further, these properties can be exhibited in a fine balance.

If the Mw of the cyanate resin is less than the above lower limit value, the insulator layer with the carrier becomes tacky when it is formed. As a result, there is a case that it becomes difficult to easily handle the insulator layer with the carrier. On the other hand, if the Mw of the cyanate resin exceeds the above upper limit value, there is a case that a reaction rate of the cyanate resin becomes too high, thereby causing defective molding of the insulator layer or lowering peel strength between the insulator layer and the conductor circuit layer when manufacturing the multilayered circuit board.

The cyanate resin having the Mw within the above range may be singly used or the cyanate resins having different Mws within the above range may be used in combination.

In this regard, it is to be noted that the Mw of the cyanate resin can be measured using, for example, a GPC (gel permeation chromatography).

In the insulator layer to be used in the present invention, the resin composition constituting the first resin layer may be the same as or different from the resin composition constituting the second resin layer. In the case where different resin compositions are used between the first resin layer and the second resin layer, kinds and/or amounts of the resins to be used or kinds and/or amounts of additives such as inorganic fillers may be changed. By using the different resin compositions between the first resin layer and the second resin layer, it is possible to design the first and second resin layers depending on required properties thereof. This makes it possible to offer a broader choice of the resins. For example, a resin layer to be embedded in the inner circuit (conductor circuit layer) may be formed of a resin composition having flexibility so that the resin layer is sufficiently embedded in the inner circuit. On the other hand, since a surface of a resin layer on which the inner circuit is to be provided is preferably subjected to a surface roughening treatment, such a resin layer may be formed of a resin composition suitable for uniformly carrying out the surface roughening treatment to the surface thereof. Therefore, by using the different resin compositions between the first resin layer and the second resin layer, different functions can be imparted to the first resin layer and the second resin layer, respectively.

In the insulator layer to be used in the present invention, the thickness of the first resin layer is not particularly limited to a specific value as long as the first resin layer can be embedded in the conductor circuit layer, but is preferably larger than that of the second resin layer. In the case where a thickness of the conductor circuit layer in which the first resin layer is to be embedded is defined as "T" and the thickness of the first resin layer is defined as "t", T and t preferably satisfy $0.3 \leq T/t \leq 1.5$, and more preferably satisfy $0.5 \leq T/t \leq 1$. In the case where the first resin layer is embedded in the conductor circuit layer, it is preferred that the first resin layer is, generally, made thicker so that it can be sufficiently embedded in the conductor circuit layer.

Among the above described fiber base members, the fiber base member to be used in the present invention is preferably the glass cloth. By way of example, a glass cloth having a thickness of 10 to 180 μm can be used. Further, a glass cloth having a basis weight (that is, a weight of the glass cloth per 1 m$^2$ thereof) of 12 to 209 g/m$^2$ also can be used. Especially, it is preferred that a thin glass cloth having a thickness of 10 to 35 μm and a basis weight of 12 to 25 g/m$^2$ is used.

In the present invention, especially, a coefficient of thermal expansion (CTE) of the glass cloth is preferably 6 ppm or less, and more preferably 3.5 ppm or less. By using the glass cloth having the coefficient of thermal expansion within the above range, it is possible to efficiently suppress the warp of the multilayered circuit board including the insulator layers to be used in the present invention and the warp of the semiconductor package in which the multilayered circuit board is used.

Furthermore, a Young's modulus of the glass cloth to be used in the present invention is preferably in the range of 62 to 100 GPa, more preferably in the range of 65 to 92 GPa, and even more preferably in the range of 86 to 92 GPa. In the case where the Young's modulus of the glass cloth is a value within the above range, it is possible to effectively suppress deformation of the multilayered circuit board which would occur due to reflow heat during a process of mounting a semiconductor element thereon. This makes it possible to improve connection reliability between the multilayered circuit board and the semiconductor element.

Further, permittivity at 1 MHz of the glass cloth to be used in the present invention is preferably in the range of 3.8 to 7.0, more preferably in the range of 4.7 to 7.0, and even more preferably in the range of 5.4 to 6.8. If the permittivity of the glass cloth is a value within the above range, it is possible to lower permittivity of the insulator layer. Such an insulator layer can be preferably used for manufacturing a semiconductor package utilizing a high speed signal.

The glass cloth having the above described coefficient of thermal expansion, Young's modulus and permittivity is preferably formed of E glass, S glass, NE glass, T glass and the like.

A thickness of the glass cloth to be used in the present invention is preferably in the range of 10 to 35 μm, and more preferably in the range of 10 to 20 μm. The number of the glass cloth to be used is not limited to one. For example, a plurality of thin glass cloths can be used by laminating them together. In this regard, in the case where the plurality of thin glass cloths are used by laminating them together, a total thickness thereof has only to be set to a value within the above range.

A method in which the resin composition to be used in the present invention is impregnated into the fiber base member is not particularly limited to a specific type. Examples of such a method include: a method in which the resin composition is dissolved into a solvent to prepare a resin composition varnish, and then the fiber base member is dipped into the resin composition varnish; a method in which the resin composition varnish is applied onto the fiber base member using various coaters; a method in which the resin composition varnish is sprayed onto the fiber base member using a sprayer; a method in which resin layers each having a carrier are laminated to both surfaces of the fiber base member, respectively; and the like. Among these methods, the method in which the fiber base member is dipped into the resin composition varnish is preferably used. By using such a method, it is possible to improve impregnating ability of the resin composition with respect to the fiber base member. In this regard, in the case where the fiber base member is dipped into the resin composition varnish, an usual impregnation application apparatus can be used.

In the case where the thickness of the fiber base member is 0.045 mm or less, the method in which the film-like resin layers are, respectively, laminated to both surfaces of the fiber base member is preferably used. An amount of the resin composition which is impregnated into the fiber base member can be freely controlled, thereby improving formability of the insulator layer. Further, by changing the thickness of each of the film-like resin layers to be laminated to both surfaces of the fiber base member, it is possible to freely adjust the thickness of each of the first and second resin layers provided on both surfaces of the fiber base member. In this regard, in the case where the film-like resin layers are laminated to both surfaces of the fiber base member, it is preferred that a vacuum laminator or the like is used.

Specifically, as a method of forming the insulator layer including the fiber base member, the following method can be used.

Figure 12:
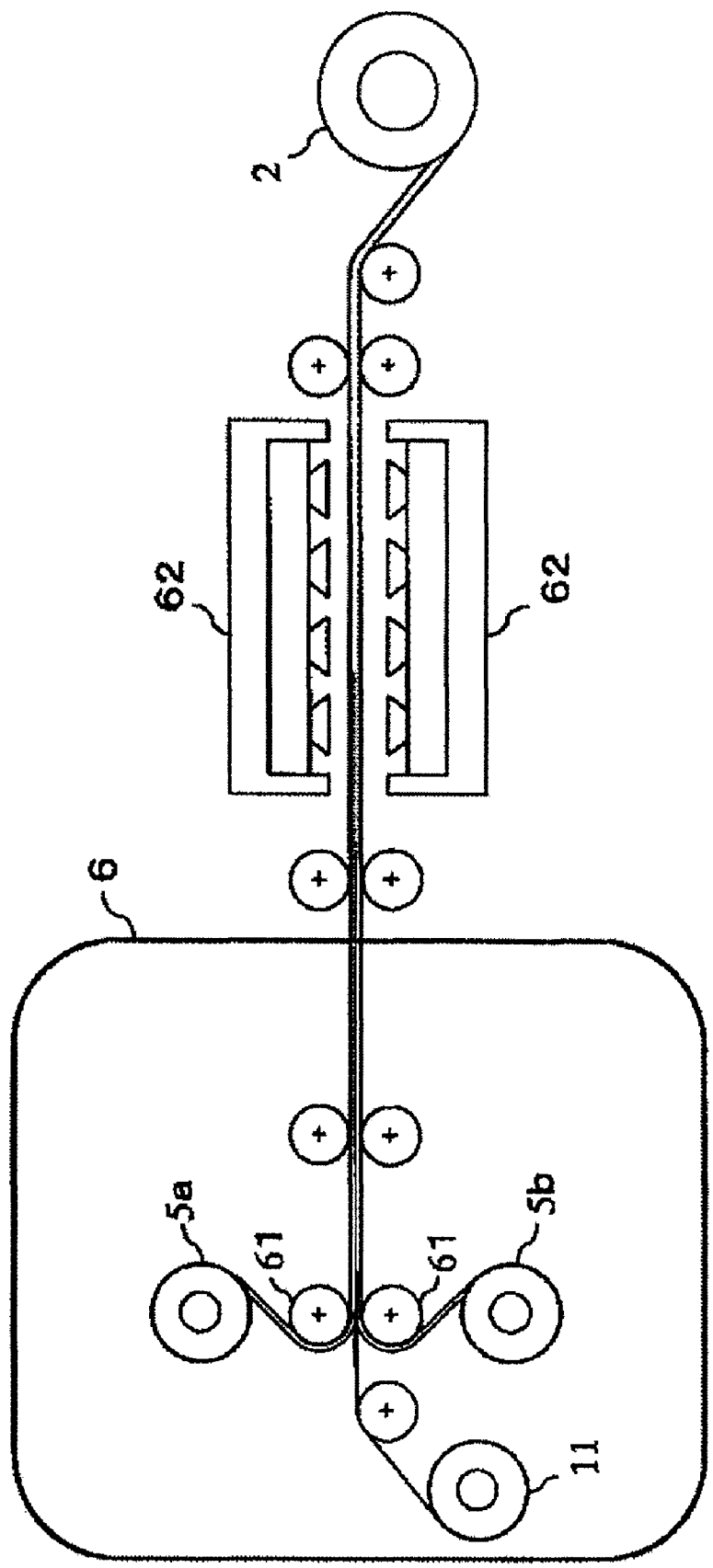
FIG. 12 is a view schematically showing a structure of an apparatus for forming the insulator layer to be used in the present invention.

FIG. 12 is a diagram showing one example of a process of forming the insulator layer 2. Here, description will be specifically made on a method of forming the insulator layer 2 by preparing carrier members 5a and 5b each having a structure in which the resin composition is applied to a carrier film in advance, laminating the carrier members 5a and 5b to both surfaces of the fiber base member 11, and then removing the carrier films from the resin compositions.

First, a carrier member 5a in which a first resin composition is applied to one carrier film and a carrier member 5b in which a second resin composition is applied to another carrier film are, in advance, prepared. At this time, by changing thicknesses (amounts) of the first resin composition and the second resin composition, it is possible to freely adjust the thickness of each of the first resin layer and the second resin layer to be provided on both surfaces of the fiber base member. Next, the carrier members 5a and 5b are laminated to the fiber base member using a vacuum laminator 6 so that the first resin composition and the second resin composition make contact with both surfaces of the fiber base member under reduced pressure, respectively, and the carrier members 5a and 5b and the fiber base member are joined together using lamination rolls 61 to obtain a laminate. In the case where the joining together of the fiber base member and the carrier members 5a and 5b is carried out under the reduced pressure, even if non-impregnated portions, into which the first resin composition and the second resin composition are not impregnated, would be created within the fiber base member or at a joint between the fiber base member and each of the carrier members 5a and 5b, the non-impregnated portions can exist as decompression voids or substantial vacuum voids. Since such decompression voids or vacuum voids can be removed easily and reliably by a heat treatment which will be described below, it is possible to suppress occurrence of voids (bubbles) in the insulator layer 2 finally obtained. Such joining together of the fiber base member and the carrier members 5a and 5b under the reduced pressure also can be carried out using another apparatus such as a vacuum box.

After completion of the joining together of the fiber base member and the carrier members 5a and 5b, the laminate is subjected to the heat treatment using a hot-air drier 62 at a temperature equal to or higher than melting points of the first and second resin compositions applied to the carrier films. By doing so, even in the case where the decompression voids or the like occur in the step of joining the fiber base member and the carrier members 5a and 5b together under the reduced pressure, it is possible to substantially remove the decompression voids or the like from the laminate. The heat treatment also can be carried out by another method using, for example, an infrared heater, a heating roller, a flat plate type hot press machine or the like.

After the carrier members 5a and 5b are laminated to the fiber base member, the carrier films are removed from the first and second resin compositions. In this way, the first and second resin compositions are carried on the fiber base member 11, to thereby obtain an insulator layer including the fiber base member 11.

Further, in the case where the fiber base member is dipped into the resin composition varnish, the solvent to be used for preparing the resin composition varnish is preferably one capable of sufficiently dissolving a resin component contained in the resin composition. However, a poor solvent may be used as the solvent to be used for preparing the resin composition varnish, as long as it does not adversely affect to the resin component. Examples of the solvent capable of sufficiently dissolving the resin component include acetone, methyl ethyl ketone, methyl isobutyl ketone, cyclohexanone, tetrahydrofuran, dimethyl formamide, dimethyl acetamide, dimethyl sulfoxide, ethylene glycol, cellosolve based solvent, carbitol based solvent, and the like.

An amount of a solid content contained in the resin composition varnish is not particularly limited to a specific value, but is preferably in the range of 40 to 80 wt %, and more preferably in the range of 50 to 65 wt %. This makes it possible to further improve the impregnating ability of the resin composition into the fiber base member. The insulator layer can be obtained by impregnating the resin composition into the fiber base member, and then drying the same at a predetermined temperature (e.g., 80 to 200° C.).

Next, although an instance of a method of manufacturing the multilayered circuit board of the present invention will be described with reference to FIGS. 3 to 11 shown in the following examples, it is not limited thereto.

EXAMPLES

Example 1

Figure 3:
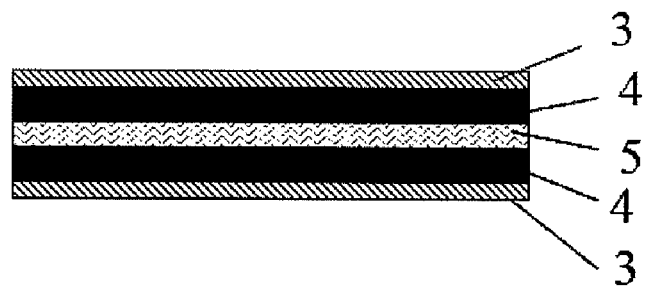
FIG. 3 is a sectional view showing one example of a support base member, for explaining the multilayered circuit board according to the present invention.
Figure 4:
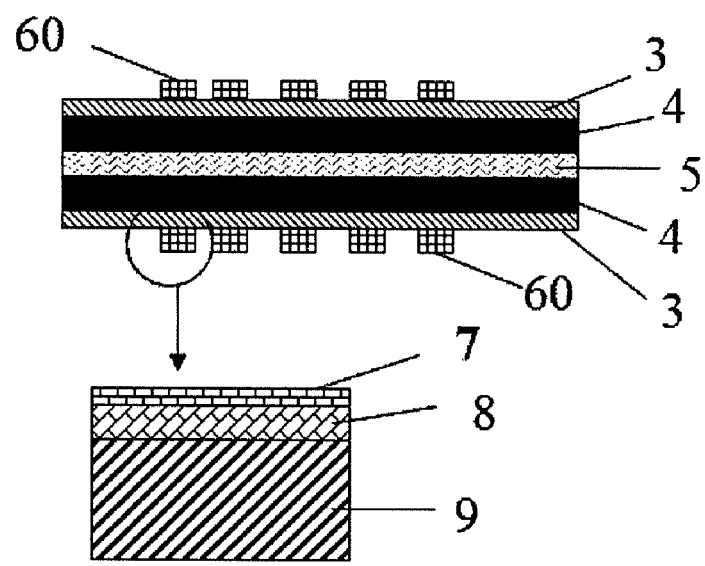
FIG. 4 is a sectional view showing one example of a state that conductor circuit layers are formed on both surfaces of the support base member, for explaining the multilayered circuit board according to the present invention.
Figure 5:
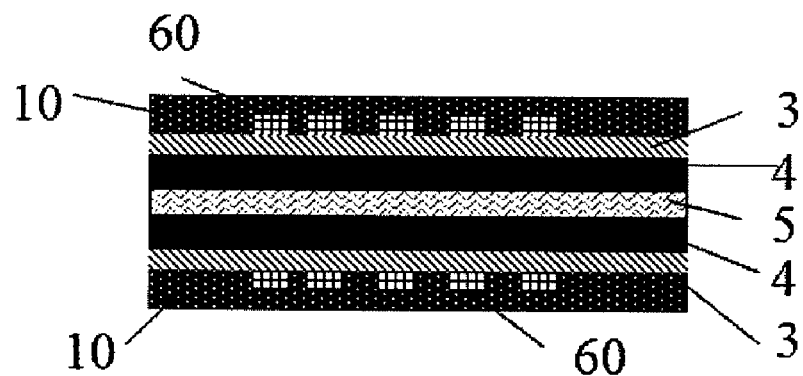
FIG. 5 is a sectional view showing one example of a state that the conductor circuit layers and insulator layers are formed on both surfaces of the support base member, for explaining the multilayered circuit board according to the present invention.
Figure 6:
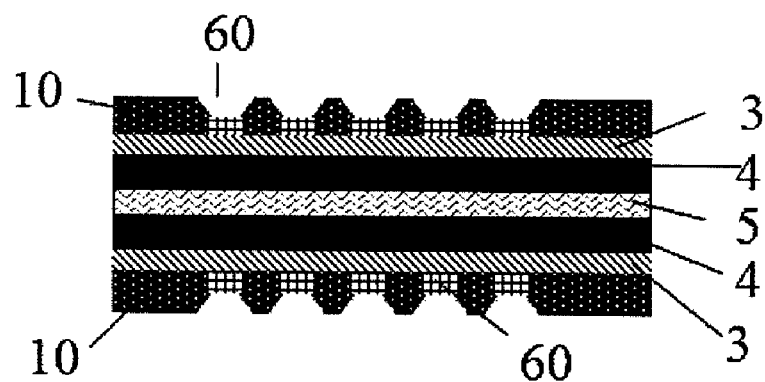
FIG. 6 is a sectional view showing one example of a state that opening portions are formed through the insulator layers using laser, for explaining the multilayered circuit board according to the present invention.

First, a prepreg 5 having a thickness of 0.2 mm ("EI-6785GS" produced by SUMITOMO BAKELITE Co., Ltd.) was placed between two peelable type copper foils with carrier copper foils each having a size of 250×250 mm square (product name of "F-DP ultra thin electrolytic copper foil with copper carrier" produced by FURUKAWA ELECTRIC Co., Ltd.) so that carrier copper foils 4 of the copper foils with carrier copper foils made contact with the prepreg 5, and then the same was pressed at a pressure of 3 MPa and heated at a temperature of 180° C. for 1 hour to obtain a support base member (see FIG. 3). In this regard, in the copper foil with carrier copper foil, a thickness of the copper foil was 9 μm and a thickness of the carrier copper foil was 70 μm.

Both surfaces of the support base member were subjected to a soft etching treatment, dry-film resists each having a thickness of 20 μm ("AR-320" produced by TOKYO OHKA KOGYO Co., Ltd.) were laminated to both surfaces of the support base member using rollers, and then the dry-film resists were exposed using a mask for forming a predetermined pattern and developed, to thereby form plating resists which would be used for forming a conductor circuit layer. Next, the following electrolytic plating treatments were carried out using the support base member as an electrolytic plating lead. Specifically, a gold plating layer 7 having a thickness of 0.1 μm was formed using an electrolytic gold plating treatment, a nickel plating layer 8 having a thickness of 3 μm was formed on the gold plating layer 7 using an electrolytic nickel plating treatment, and then a copper plating layer 9 having a thickness of 14 μm was formed on the nickel plating layer 8 using an electrolytic copper plating treatment. In this way, conductor circuit layers 60 were formed on both surfaces of the support base member. Next, the dry-film resists (plating resists) were removed from the support base member (see FIG. 4).

Next, a surface of each conductor circuit layer 60 was subjected to a dipping treatment for 90 seconds using a surface roughening liquid ("Bond Film" produced by Atotech Japan). Thereafter, an insulator layer "a" having a thickness of 40 μm and including a glass cloth ("APL-3651" produced by SUMITOMO BAKELITE Co., Ltd.) was cut 240×240 mm square. In this regard, the kind of the glass cloth was a glass non-woven cloth having a thickness of 12 μm ("EPC4015" produced by Japan Vilene Co., Ltd.), and the insulator layer "a" was supported by a PET film which was a support film. The insulator layer "a" was laminated to the surface of each conductor circuit layer 60 using a vacuum press machine ("MVLP-500/600-IIA" produced by MEIKI Co., Ltd.) at a first heating and pressing condition in which a temperature was 80° C. and a pressure was 0.5 MPa and at a second heating and pressing condition in which a temperature was 10° C. and a pressure was 1.0 MPa. Thereafter, the insulator layers "a" was heated at a temperature of 150° C. for 30 minutes, and then the PET films were removed from the insulator layers "a", to thereby obtain insulator layers 10 provided on both surfaces of the support base member (see FIG. 5).

Next, opening portions were formed through each insulator layer 10 using a $CO_2$ laser beam machine ("LG-2G212" produced by Hitachi Via Mechanics, Ltd.) at a first processing condition in which a pulse width was 6 μsec and a shot number was 1 and a second processing condition in which a pulse width was 2 μsec and a shot number was 1. Thereafter, in order to carry out surface washing and activation of the insulator layers 10, the support base member on which the insulator layers 10 were provided was dipped into a solution containing mono-ethyl butyl alcohol as a major component ("MLB conditioner" produced by Rohm and Haas Company) and having a temperature of 80° C. for 5 minutes, dipped into an oxidizing surface roughening liquid containing potassium permanganate as a major component ("MLB promoter" produced by Rohm and Haas Company) and having a temperature of 80° C. for 10 minutes, and then dipped into a sulfuric acid liquid ("MLB neutralizer" produced by Rohm and Haas Company) having a temperature of 40° C. for 5 minutes and subjected to water washing and hot water washing to remove manganese residue therefrom (see FIG. 6).

Next, an electroless copper plating layer having a thickness of 1.0 μm was formed on a surface of each conductor circuit layer 60 and a surface of each insulator layer 10 using an electroless copper plating solution ("Print Gantt MSK-DK series" produced by Atotech), and then a photosensitive dry-film ("AR-320" produced by TOKYO OHKA KOGYO Co., Ltd.) was laminated to the electroless copper plating layer using a laminating machine. Thereafter, the photosensitive dry-film was exposed and developed to form a plating resist, an electrolytic copper plating layer having a thickness of 14 μm was formed on a surface of the electroless copper plating layer where was exposed from the plating resist.

Figure 7:
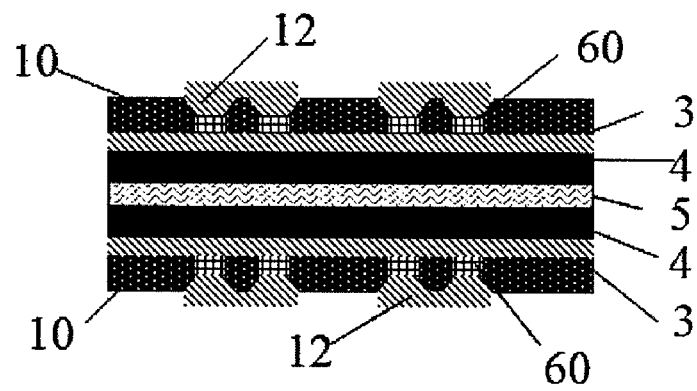
FIG. 7 is a sectional view showing one example of a state that conductor circuit layers are formed on surfaces of the insulator layers corresponding to the opening portions, for explaining the multilayered circuit board according to the present invention.

Next, the plating resist was removed from the electroless copper plating layer, a portion of the electroless copper plating layer where was exposed from the electroless copper plating layer was removed using a soft etching solution ("SAC" produced by EBARA DENSAN Ltd.) to obtain a conductor circuit layer 12 including the electroless copper plating layer and the electrolytic copper plating layer, and then the conductor circuit layer 12 was subjected to a heating treatment at 200° C. for 60 minutes (see FIG. 7).

Figure 8:
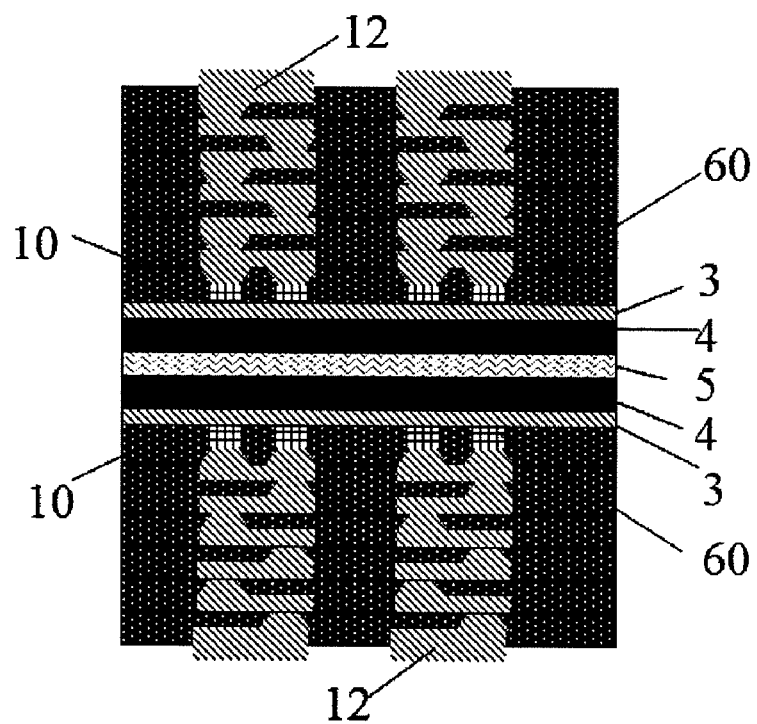
FIG. 8 is a sectional view showing one example of a state that seven conductor circuit layers and six insulator layers are laminated alternately on each surface of the support base member, for explaining the multilayered circuit board according to the present invention.

By repeating the above steps, six insulator layers 10 and six conductor circuit layers 12 were laminated alternately on a side of one surface of the support base member (see FIG. 8).

Figure 9:
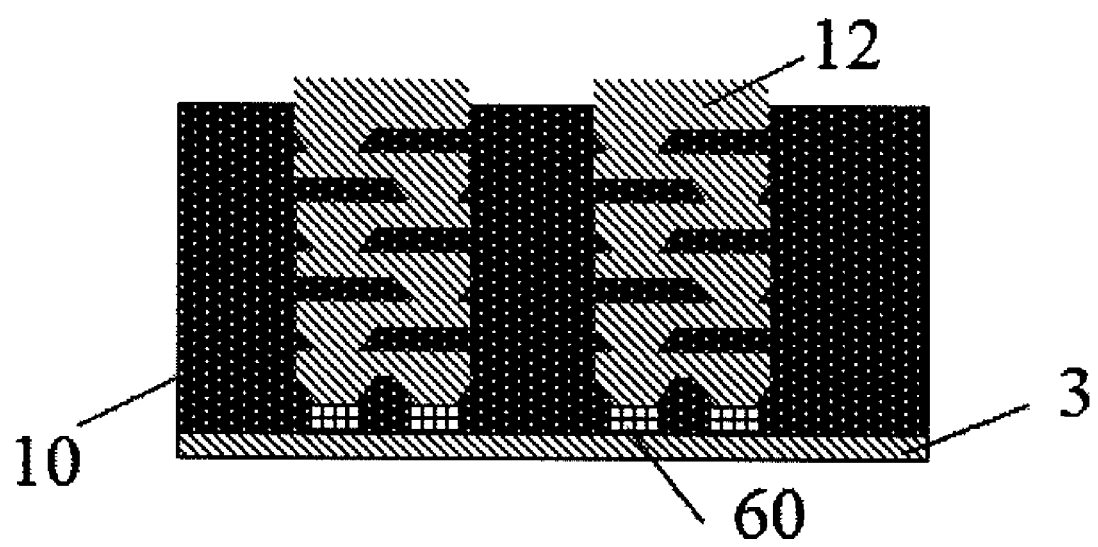
FIG. 9 is a sectional view showing one example of a multilayered circuit board with a copper foil obtained by removing the copper foil from a carrier copper foil in the support base member, for explaining the multilayered circuit board according to the present invention.

Next, each copper foil with carrier copper foil included in the support base member was separated into the carrier copper foil 4 and the copper foil 3, to thereby obtain two multilayered circuit boards with the copper foils 3 (see FIG. 9).

Figure 10:
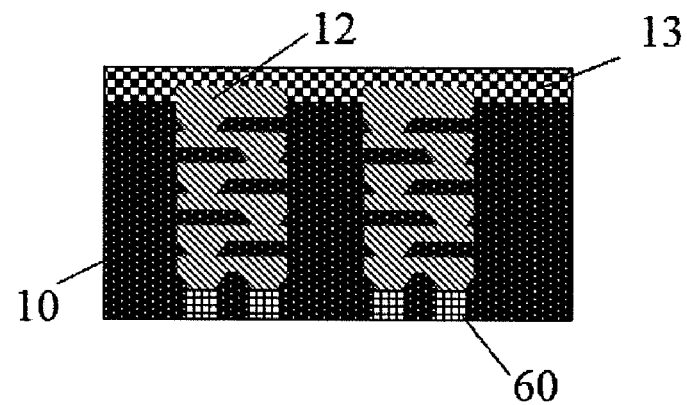
FIG. 10 is a sectional view showing one example of a state that a masking tape is attached to the conductor circuit layer of the multilayered circuit board opposite from the copper foil and the copper foil is removed from the multilayered circuit board, for explaining the multilayered circuit board according to the present invention.

Next, a masking tape 13 ("ELEP Masking N-380" produced by NITTO DENKO Corporation) was attached on a surface of the multilayered circuit board with the copper foil 3 from which the conductor circuit layer 12 was bared so that the following etching solution did not make contact with the conductor circuit layer 12, the same was dipped into the etching solution (ferric chloride solution 40° Be), to thereby remove the copper foil 3 from the multilayered circuit board (see FIG. 10). At this time, since the gold plating layer 7 served as an etching resist by being exposed from the multilayered circuit board even after the copper foil 3 was removed therefrom, the conductor circuit layers 12 were not dissolved by the etching solution.

Next, the masking tape 13 was removed from the multilayered circuit board, and then another masking tape was attached to another surface of the multilayered circuit board from which the gold plating layer 7 appeared. Thereafter, the surface of the conductor circuit layer 12 was subjected to a dipping treatment for 90 seconds using a surface roughening liquid ("Bond Film" produced by Atotech Japan), to roughen the surface of the conductor circuit layer 12. Next, a solder resist layer 14 was formed on the surface of the multilayered circuit board to which the masking tape was not attached by printing a solder resist ("PSR-4000 AUS703" produced by TAIYO INK MFG. Co., Ltd.) using a screen printer ("FORCE2525" produced by MINO GROUP Co., Ltd.). Thereafter, the solder resist layer 14 was exposed using a predetermined mask so as to expose the conductor circuit layer 12 from the solder resist layer 14, developed and cured. In this regard, at this time, a thickness of the solder resist layer 14 became 12 μm.

Next, an electroless nickel plating layer having a thickness of 3 μm was formed on the conductor circuit layer 12 exposed from the solder resist layer 14, and then an electroless gold plating layer having a thickness of 0.1 μm was formed on the electroless nickel plating layer, to thereby obtain a plating layer 15 including the electroless nickel plating layer and the electroless gold plating layer. Thereafter, the masking tape was removed from the multilayered circuit board, and then the multilayered circuit board was cut into 25 small sized multilayered circuit boards each having a single-side laminated structure and a size of 40×40 mm square using a router processing machine (see FIG. 11).

Figure 11:
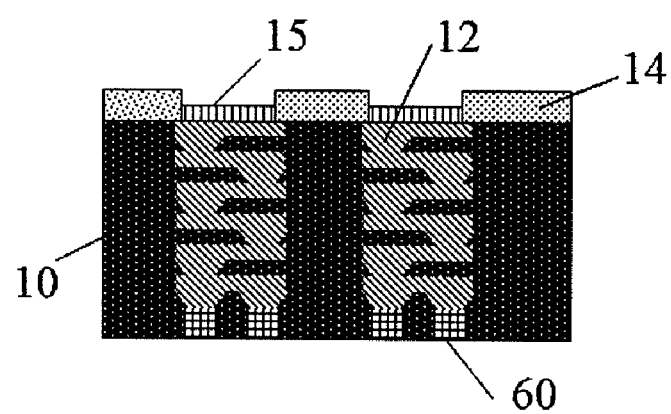
FIG. 11 is a sectional view showing one example of a state that a solder resist layer and a plating layer are formed on one surface of the multilayered circuit board, for explaining the multilayered circuit board according to the present invention.

In this regard, it is to be noted that in the multilayered circuit board shown in FIG. 11, a lower surface thereof serves as a semiconductor chip mounting portion and an upper surface thereof serves as a BGA ball mounting portion.

Example 2

Basically, multilayered circuit boards each having a single-side laminated structure were manufactured in the same manner as in Example 1 except that insulator layers "b" each having a thickness of 40 μm ("APL-3601" produced by SUMITOMO BAKELITE Co., Ltd.) were used instead of the insulator layers "a". In this regard, each insulator layer "b" was supported by a PET film which was a support film.

Hereinbelow, description will be made to points different from Example 1.

The insulator layer "b" was laminated to the surface of each conductor circuit layer 60 using a vacuum press machine ("MVLP-500/600-IIA" produced by MEIKI Co., Ltd.) at a first heating and pressing condition in which a temperature was 80° C. and a pressure was 0.5 MPa and at a second heating and pressing condition in which a temperature was 100° C. and a pressure was 1.0 MPa. Thereafter, the PET films were removed from the insulator layers "b", and then the insulator layers "b" were heated at a temperature of 170° C. for 45 minutes, to thereby obtain insulator layers 10 provided on both surfaces of the support base member.

Next, opening portions were formed through each insulator layer 10 using an UV-YAG laser beam machine ("ML605LDX" produced by Mitsubishi Electric Corporation) at a processing condition in which a tip output was 94 μJ and a shot number was 30.

In order to carry out surface washing and activation of the insulator layers 10 through which the opening portions had been formed, the following treatments were carried out. Namely, the support base member on which the insulator layers 10 were provided was dipped into a solution containing mono-ethyl butyl alcohol as a major component ("MLB conditioner" produced by Rohm and Haas Company) and having a temperature of 80° C. for 10 minutes, dipped into an oxidizing surface roughening liquid containing potassium permanganate as a major component ("MLB promoter" produced by Rohm and Haas Company) and having a temperature of 80° C. for 20 minutes, and then dipped into a sulfuric acid liquid ("MLB neutralizer" produced by Rohm and Haas Company) having a temperature of 40° C. for 5 minutes and subjected to water washing and hot water washing to remove manganese residue therefrom.

25 multilayered circuit boards each having a single-side laminated structure and a size of 40×40 mm square were manufactured in the same manner as in Example 1 except for the above described points.

Example 3

1. Preparation of Resin Composition Varnish 15 parts by weight of novolak type cyanate resin having a weight average molecular weight of about 2,600 ("Primaset PT-30" produced by LONZA Japan) as a thermosetting resin, 8 parts by weight of biphenyl dimethylene type epoxy resin having an epoxy equivalent of 275 ("NC-3000P" produced by Nippon Kayaku Co., Ltd.) as an epoxy resin, 7 parts by weight of biphenyl dimethylene type phenolic resin having a hydroxyl equivalent of 203 ("MEH-7851-S" produced by Meiwa Plastic Industries, Ltd.) as a phenolic resin, and an epoxy silane type coupling agent ("A-187" produced by Nippon Unicar Co., Ltd.) as a coupling agent in an amount of 0.3 part by weight per 100 parts by weight of total inorganic fillers (which would be described below) were dissolved into methyl ethyl ketone at room temperature to obtain a mixture. Next, 20 parts by weight of spherical molten silica having an average particle size of 0.3 μm ("SFP-10X" produced by Denki Kagaku Kogyo K.K.) and 50 parts by weight of spherical molten silica having an average particle size of 1.5 μm ("SO-32R" produced by Admatechs Co., Ltd.) as inorganic fillers were added into the mixture, and the same was stirred using a high speed stirring machine for 10 minutes. In this way, a resin composition varnish was prepared.

2. Forming of Carrier Member

A polyethylene terephthalate film ("SFB-38" produced by Mitsubishi Polyester Film Corporation) having a thickness of 38 μm and a width of 480 mm was prepared as a carrier film, and then the above described resin composition varnish was applied to the polyethylene terephthalate film using a comma coater and dried using a drier at 170° C. for 3 minutes. In this way, a carrier member 1 was obtained. In this regard, it is to be noted that in the thus obtained carrier member 1, a resin layer (that is, a resin layer eventually used as a first resin layer) having a thickness of 20 μm and a width of 410 mm was centrally located on the polyethylene terephthalate film in a width direction thereof.

A carrier member 2 was obtained in the same manner as in the case of the carrier member 1 except that an amount of the resin composition varnish applied to the polyethylene terephthalate film was changed. In this regard, it is to be noted that in the thus obtained carrier member 2, a resin layer (that is, a resin layer eventually used as a second resin layer) having a thickness of 8 μm and a width of 360 mm was centrally located on the polyethylene terephthalate film in a width direction thereof.

3. Forming of Insulator Layer "d"

A glass woven cloth constituted from E glass (a cloth type thereof was #1015, a width thereof was 360 mm, a thickness thereof was 15 μm, and a basis weight thereof was 17 g/m$^2$) was prepared as a fiber base member, and an insulator layer "d" including the glass woven cloth was formed using a vacuum laminator and a hot-air drier shown in FIG. 12.

More specifically, the carrier member 1 was laminated to one surface of the glass woven cloth and the carrier member 2 was laminated to the other surface of the glass woven cloth so that the carrier members 1 and 2 were centrally located in a width direction of the glass woven cloth, and then the carrier member 1, the carrier member 2 and the glass woven cloth were joined together using laminating rolls at 80° C. under reduced pressure of 750 Torr to obtain a laminate.

In this regard, it is to be noted that, in an inside area of the laminate which lay within the width of the glass woven cloth, the resin layer of the carrier member 1 was joined to the one surface of the glass woven cloth and the resin layer of the carrier member 2 was joined to the other surface of the glass woven cloth, and in an outside area of the laminate which did not lie within the width of the glass woven cloth, the resin layer of the carrier member 1 and the resin layer of the carrier member 2 were joined together.

Next, the thus obtained laminate was passed through a hot-air drier kept at 120° C. for 2 minutes using a horizontal conveyor so that the laminate was subjected to a heat treatment without applying pressure thereto. In this way, an insulator layer "d" having a thickness of 35 μm (a thickness of the first resin layer was 16 μm, a thickness of the fiber base member was 15 μm and a thickness of the second resin layer was 4 μm) was obtained.

Basically, 25 multilayered circuit boards each having a single-side laminated structure and a size of 40×40 mm square were manufactured in the same manner as in Example 1 except that the insulator layers "d" were used instead of the insulator layers "a", and each of the insulator layers "d" was used so that the first resin layer was positioned at a side of the conductor circuit layer 60.

Comparative Example 1

Basically, multilayered circuit boards each having a single-side laminated structure were manufactured in the same manner as in Example 1 except that insulator layers "c" each having a thickness of 40 μm ("ABF-GX13" produced by Ajinomoto Co., Inc.) were used instead of the insulator layers "a". In this regard, each insulator layer "c" was supported by a PET film which was a support film.

Hereinbelow, description will be made to points different from Example 1.

The insulator layer "c" was laminated to the surface of each conductor circuit layer 60 using a vacuum press machine ("MVLP-500/600-IIA" produced by MEIKI Co., Ltd.) at a first heating and pressing condition in which a temperature was 105° C. and a pressure was 0.6 MPa and at a second heating and pressing condition in which a temperature was 105° C. and a pressure were 0.5 MPa. Thereafter, the PET films were removed from the insulator layers "c", and then the insulator layers "c" was heated at a temperature of 180° C. for 30 minutes, to thereby obtain insulator layers 10 provided on both surfaces of the support base member.

Next, opening portions were formed through each insulator layer 10 using an UV-YAG laser beam machine ("ML605LDX" produced by Mitsubishi Electric Corporation) at a processing condition in which a tip output was 70 μJ and a shot number was 30.

In order to carry out surface washing and activation of the insulator layers 10 through which the opening portions had been formed, the following treatments were carried out. Namely, the support base member on which the insulator layers 10 were provided was dipped into a solution containing mono-ethyl butyl alcohol as a major component ("MLB conditioner" produced by Rohm and Haas Company) and having a temperature of 80° C. for 5 minutes, dipped into an oxidizing surface roughening liquid containing potassium permanganate as a major component ("MLB promoter" produced by Rohm and Haas Company) and having a temperature of 80° C. for 20 minutes, and then dipped into a sulfuric acid liquid ("MLB neutralizer" produced by Rohm and Haas Company) having a temperature of 40° C. for 5 minutes and subjected to water washing and hot water washing to remove manganese residue therefrom.

25 multilayered circuit boards each having a single-side laminated structure and a size of 40×40 mm square were manufactured in the same manner as in Example 1 except for the above described points.

Hereinbelow, items and methods of evaluations will be described.

Each of the evaluations was carried out as follows.

<Glass Transition Temperature and Modulus of Elasticity>

Two insulator layers were laminated together using an atmospheric pressure laminater, and then cured at 200° C. for 2 hours to obtain a resin cured product. The resin cured product was cut into a test piece having a width of 5 mm, a length of 30 mm and a thickness of 80 μm.

Dynamic viscoelasticity was measured by heating the test piece at a temperature rising rate of 3° C./minute and applying stress thereto at frequency of 10 Hz using a dynamic viscoelasticity measuring apparatus ("DMS6100" produced by Seiko Instruments, Inc.). A glass transition temperature (Tg) of the test piece was determined based on a peak value of tan δ in a measurement result, and values of moduluses of elasticity of the test piece at 25° C. and 250° C. were obtained based on the measurement result, respectively.

<Coefficient of Thermal Expansion>

Two insulator layers were laminated together using an atmospheric pressure laminater, and then cured at 200° C. for 2 hours to obtain a resin cured product. The resin cured product was cut into a test piece having a size of 4 mm×20 mm. A coefficient of thermal expansion of the test piece was measured at a temperature rising rate of 10° C./min using a TMA apparatus (produced by TA Instruments). "α1" means a coefficient of thermal expansion at the glass transition temperature or lower of the test piece, and "α2" means a coefficient of thermal expansion at the glass transition temperature or higher of the test piece.

<Modulus of Elasticity in Tension>

Two insulator layers were laminated together using an atmospheric pressure laminater, and then cured at 200° C. for 2 hours to obtain a resin cured product. A modulus of elasticity in tension of the resin cured product was measured in a tension mode at a loading full scale of 20 kgf and a speed of 5 mm/min.

<Warp Amount of Multilayered Circuit Board Based on Temperature Changes Thereof>

A warp amount of the thus obtained multilayered circuit board was measured using a variable temperature laser three dimension measuring machine ("type: LS220-MT100MT50" produced by Hitachi Technologies and Services, Ltd.). In a plurality of portions of the multilayered circuit board, displacement amounts in a thickness direction thereof were measured. The displacement amount of the portion which was most displaced was defined as the warp amount of the multilayered circuit board. In this regard, it is to be noted that the above measurement was carried out at 4 measurement temperatures of −55° C., 25° C., 150° C. and 260° C. The symbols in Table 1 are defined as follows.

A: The warp amounts of the multilayered circuit board were 200 μm or less at all measurement temperatures.

B: The warp amounts of the multilayered circuit board were 400 μm or less at all measurement temperatures.

C: The warp amounts of the multilayered circuit board were 600 μm or less at all measurement temperatures.

D: The warp amounts of the multilayered circuit board were 800 μm or less at all measurement temperatures.

Physical property values of the insulator layers and the above evaluation results are shown in Table 1.

[Table 1]

TABLE 1

| | | Ex. 1 | Ex. 2 | Ex. 3 | Comp. Ex. 1 |
|---|---|---|---|---|---|
| Insulator layer | | a | b | d | c |
| Glass transition temperature | (° C.) | 200 | 180 | 200 | 165 |
| Modulus of elasticity in tension | 25° C. (GPa) | 12 | 13 | 12 | 5 |
| | 250° C. (GPa) | 6.2 | 0.8 | 6.8 | 0 |
| Coefficient of thermal expansion | α1 (ppm) | 29 | 28 | 29 | 29 |
| | α2 (ppm) | 72 | 73 | 71 | 63 |
| Warp amount of board | Based on temperature changes | A | B | A | C |

As can be seen from the evaluation results shown in Table 1, each of the multilayered circuit board obtained in Examples 1 to 3 has an small warp amount due to temperature changes thereof. On the other hand, the multilayered circuit board obtained in Comparative Example 1 has a large warp amount due to temperature changes thereof. It can be conceived that the modulus of elasticity of the insulator layer of Comparative Example 1 is low, and that a difference between the coefficients of thermal expansion of the insulator and conductor circuit layers is large.

INDUSTRIAL APPLICABILITY

According to the present invention, since a difference between the coefficients of thermal expansion of the insulator and conductor circuit layers is small, internal stress which would occur therebetween becomes small. As a result, warp of the multilayered circuit board becomes small. Further, it becomes difficult for the multilayered circuit board to warp in the step of mounting a semiconductor element thereon, and it also becomes difficult for a semiconductor device in which the multilayered circuit board is used to warp in the step of carrying out a reliability test. Thus, the present invention has industrial applicability.

What is claimed is:

1. A multilayered circuit board having a single-side laminated structure, the multilayered circuit board which does not include a core substrate having via-holes formed therethrough and vias for providing electrical connection through the via-holes, comprising:

a plurality of pairs of layers, each pair including a conductor circuit layer and an insulator layer, wherein a glass transition temperature of each insulator layer is 170° C. or higher, a coefficient of thermal expansion at the glass transition temperature or lower of each insulator layer is 35 ppm or less, and a modulus of elasticity of each insulator layer is 5 GPa or more, wherein the insulator layer includes at least a first resin layer, a second resin layer, and a fiber base member provided between the first and second resin layers, and wherein when a thickness of the first resin layer is defined as "B1" and a thickness of the second resin layer is defined as "B2", B1 and B2 satisfy 0<B2/B1≦1.

2. The multilayered circuit board as claimed in claim 1, wherein a thickness of the fiber base member included in the insulator layer is in the range of 10 to 35 mu.m.

3. The multilayered circuit board as claimed in claim 1, wherein the fiber base member is a glass cloth.

4. The multilayered circuit board as claimed in claim 1, wherein the insulator layer is formed of a resin composition containing cyanate resin.

5. A semiconductor device in which the multilayered circuit board defined by claim 1 is used.

* * * * *